United States Patent [19]

Kling et al.

[11] Patent Number: 4,904,539

[45] Date of Patent: Feb. 27, 1990

[54] CONTINUOUS STRIP OF ELECTRICAL COMPONENT ASSEMBLIES AND METHOD OF MAKING SAME

[75] Inventors: John P. Kling, Mt. Joy; Richard F. Stone, Jr., Elizabethtown, both of Pa.

[73] Assignee: AMP Incorporated, Harrisburg, Pa.

[21] Appl. No.: 298,251

[22] Filed: Jan. 17, 1989

Related U.S. Application Data

[63] Continuation of Ser. No. 103,089, Sep. 30, 1987, abandoned.

[51] Int. Cl.[4] .............................................. H05K 13/00

[52] U.S. Cl. .................................... 428/572; 428/577; 29/592.1; 29/464

[58] Field of Search ................ 333/182, 183; 428/571, 428/572, 577, 583, 573–575; 29/854, 464, 466, 467, 592.1

[56] References Cited

U.S. PATENT DOCUMENTS

| | | | |
|---|---|---|---|
| Re. 29,258 | 7/1977 | Fritz | 333/70 S |
| 2,871,551 | 2/1959 | Harris | 428/571 |
| 3,437,460 | 4/1969 | Berg | 428/571 |
| 3,539,954 | 11/1970 | Camine | 333/183 |
| 3,725,825 | 3/1973 | Hudson, Jr. | 333/79 |
| 3,961,295 | 6/1976 | Hollyday et al. | 333/79 |
| 4,129,682 | 12/1978 | Stewart et al. | 428/572 |
| 4,252,864 | 2/1981 | Coldren | 428/571 |
| 4,451,973 | 6/1984 | Tateno et al. | 428/572 |
| 4,652,842 | 3/1987 | Kling et al. | 333/182 |

*Primary Examiner*—John J. Zimmerman

*Attorney, Agent, or Firm*—Katherine A. Nelson

[57] ABSTRACT

A continuous strip (200) of electrical component assemblies (22) is disclosed, together with method of manufacturing thereof. The components are made by stamping a metal strip to form an intermediate article having a plurality of first and second members (28, 38) integrally extending therefrom and joined thereto at spaced locations therealong. Each first member (28) has at least one second member (38) associated with and adjacent to it. The second members (38) include locating means (42) for enabling at least third members (56) to be assembled to the first members (28) in a precisely located relationship. The first members (28) may also include further locating means (37) for fourth members (46) to be included in the assembly. The strip thus provides its own fixturing means for precisely locating the various members of electronic component assemblies.

21 Claims, 5 Drawing Sheets

CONTINUOUS STRIP OF ELECTRICAL COMPONENT ASSEMBLIES AND METHOD OF MAKING SAME

This appliction is a Continuation of Application Ser. No. 07/103,089 filed Sept. 30, 1987, now abandoned.

The present invention relates to a continuous strip of electrical component assemblies and in particular to a method for making a continuous strip of filtered component assemblies.

BACKGROUND OF THE INVENTION

The use of electronic filter devices to remove radio frequency and electromagnetic interference is well known. With the increasing complexity and miniaturization of modern electronic systems, many pieces of equipment require and often it is necessary to provide protection for individual lines in a system, wherein a conductor is connected to an individual filter assembly then mounted to a circuit board, back plane or the like. Often the locations in the system require that the line be individually controlled with what is known as a loose piece filter assembly, such as those described in U.S. Pat. No. 3,961,295 and 3,725,825.

Generally, loose piece filter assemblies are made as individual items usually in a batch process, which requires a series of fixturing devices to hold the various components in alignment during each step of the manufacturing process. Typically the process involves a very labor intensive series of steps to make successive batches, each batch comprising a relatively small number of individual assemblies.

It is also desirable that the assemblies be made such that they are removably secured to a continuous carrier strip, which can be wound onto a reel, thus providing a convenient means to store and ship the assemblies.

Furthermore, it is desirable to have a method of manufacturing such assemblies that will eliminate many, if not all, of the fixturing devices associated with locating the various members of the assemblies in their proper position prior to securing the members together.

The present invention is directed to overcoming the problems and difficulties associated with making loose piece assemblies.

SUMMARY OF THE INVENTION

In accordance with the present invention, a method is disclosed for making a continuous strip of assembled "loose piece" assemblies wherein the strip provides its own fixtures for aligning the various members of the individual component assemblies. Having the individual components integrally joined to a carrier strip allows for ease of manufacturing, ease of assembly, ease of testing and ease of use in an end application for the assembly. The strip of completed assemblies can be shipped on a reel or the assemblies may be removed from the strip and sold as loose piece assemblies depending upon the desires of the customer. The assemblies are joined to the strip in a precise location so that the strip of assemblies may be used in automated processes, and in particular, robotic processes. The invention disclosed herein eliminates tooling and fixtures required for making the assemblies. The invention provides a continuous method for making a strip of electrical assemblies. In accordance with this invention a continuous strip of assemblies can be quickly and economically manufactured.

The assemblies of the preferred embodiment have an electrical pin terminal on which is mounted a filter sleeve such as the type disclosed in U.S. Pat. No. RE 29,258 and a metal shell member in the form of an eyelet or environmentally sealed bolt-type connector. The method comprises: stamping a carrier strip having a plurality of first and second members extending therefrom at selected locations therealong and integrally joined thereto; positioning the first and second members such that each first member is associated with and lies alongside at least one of the second members; providing means on the first members for positioning a further component, such as a before "filter" filter member thereon, the filter member having a bore and being dimensioned to receive and be electrically connected to and engaged with the first member; providing fixturing means on the second members for positioning third members on the filtered first members, the third members being aligned in a precise location on the filtered first members by said fixturing means.

In the preferred embodiment, the fixturing means on the second members is the forward edge of the second members. Other means, such as outwardly extending projections may also be used. Additional positioning means may be provided on the first or second members to position further elements of an assembly if required. Alternatively an additional positioning member may be stamped on the opposite side of the carrier strip which may be used to provide a further means for positioning additional elements of an assembly.

It is the object of the invention to provide a method for making a continuous strip of severable electrical components.

It is a further object of the invention to provide a fully automatable system for manufacturing a continuous strip of electrical component assemblies.

It is an additional object of the invention to provide a strip of electrical component assemblies that may be reeled for shipping.

It is also an object of the invention to provide a means for manufacturing that eliminates separate fixturing devices for aligning the members of electrical component assemblies.

It is another object of the invention to provide an intermediate article for use in making a continuous strip of assemblies.

It is also an object of the invention to stamp a continuous strip that has integrally formed fixturing means for precisely locating the members of an electrical component assembly.

The foregoing and other objects, features, and advantages of the invention will become apparent from a reading of the following specification. Embodiments of the present invention will be described by way of example with reference to the accompanying drawings.

DETAILED DESCRIPTION OF THE DRAWINGS

Figure 1:
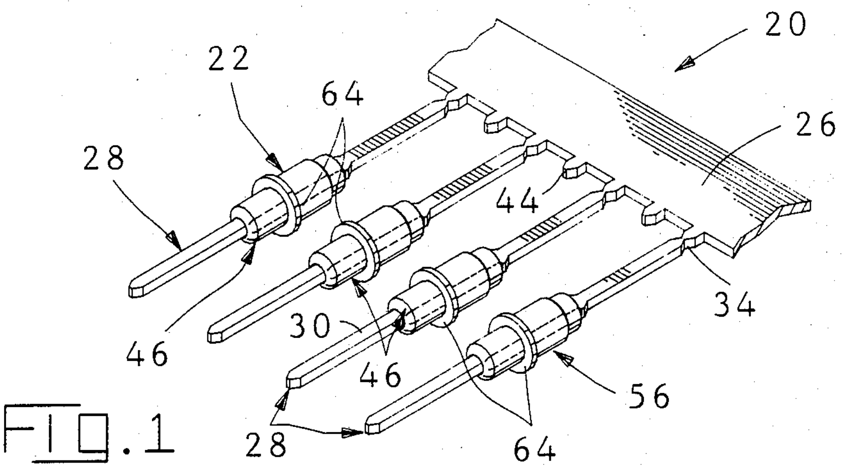
FIG. 1 is a perspective view of a continuous strip of electrical component assemblies made in accordance with the invention.

FIGS. 1–5 illustrate the steps in manufacturing a continuous strip 20 of assemblies 22 as shown in FIG. 1. Assemblies 22 are known in the industry as filtered eyelets. Generally they are used to provide support for filter members that are mounted to back panels or the like. It is to be understood that this component is merely representative of the various types of electrical components that can be made in accordance with this invention.

Figure 2:
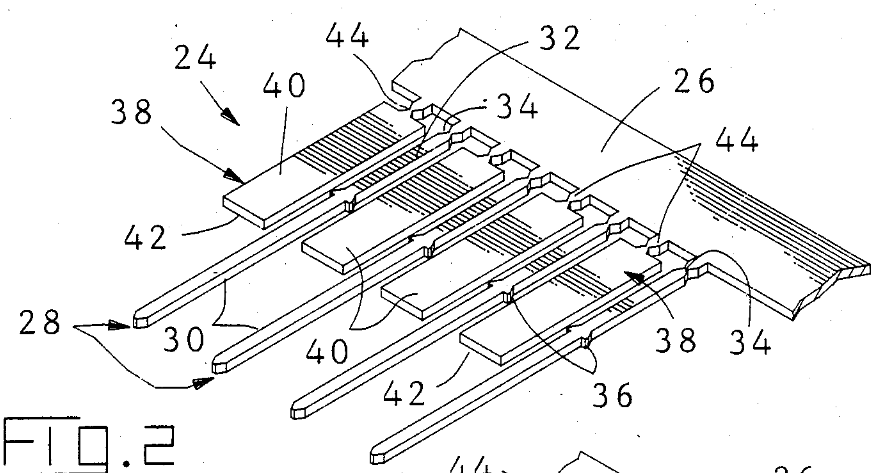
FIG. 2 is a perspective view of the stamped metal strip used in manufacturing the assemblies of FIG. 1.

In manufacturing eyelet assemblies 22, a continuous strip of metal is stamped into lead frame 24 as illustrated in FIG. 2. Lead frame 24 is comprised of carrier strip 26 having a plurality of first and second members 28,38 integrally extending therefrom and joined thereto at spaced locations along the strip. First and second members 28,38 extend outwardly and essentially perpendicular to the length of carrier strip 26. First and second members 28,38 are joined to carrier strip 26 at severable sections 34,44 respectively. First members 28 have first and second contact sections 30,32, and fixturing means 36 which extends outwardly in the plane of first members 28 intermediate first and second contact sections 30,32. Second members 38 are positioned on opposing sides of first members 28. In the embodiment of FIGS. 1–5, free ends 40 of second means 38 extend beyond fixturing means 36 on first members 28. As will be explained more fully later, leading edges 42 of second members 38 provide means for positioning components such as housings or outer members 56 to the intermediate assemblies.

Figure 3:
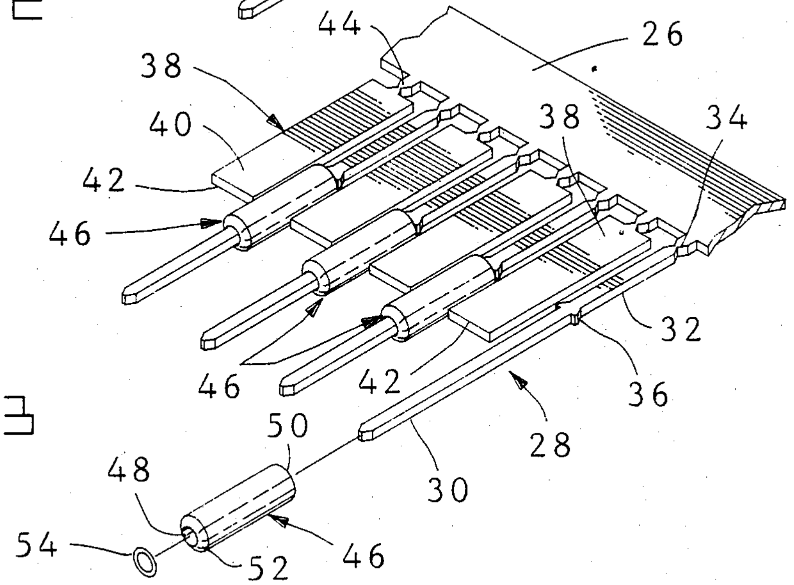
FIG. 3 is a perspective view of a strip of partially assembled components having the filter member exploded from one of the members extending from the frame of FIG. 2.
Figure 4:
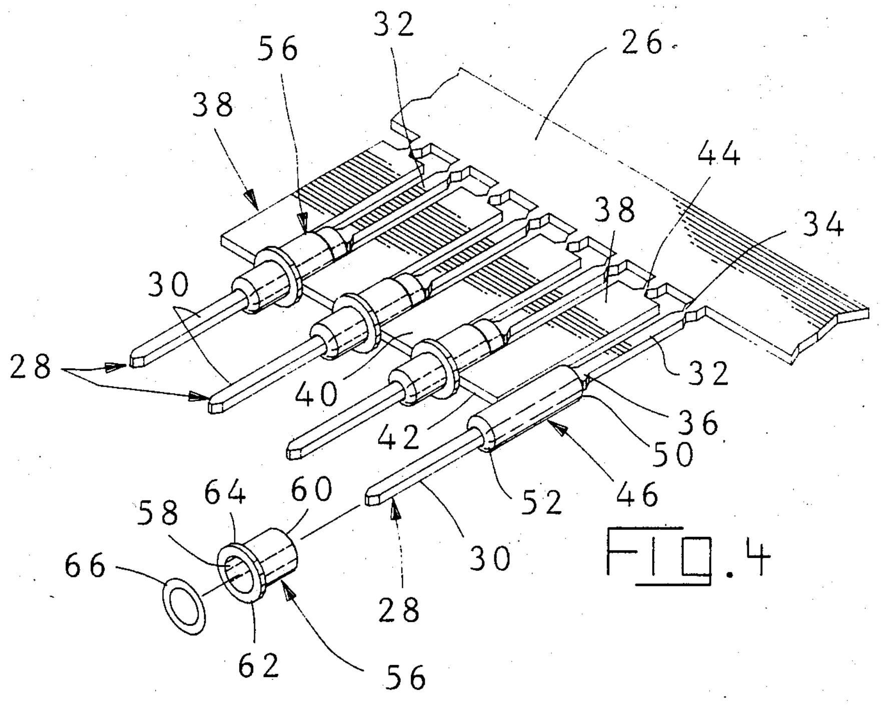
FIG. 4 is a perspective view of the assembled component having an outer member partially exploded from one of the partially assembled components of FIG. 3.

In assembling eyelet assemblies 22 of FIG. 1, further components such as for example, filter members 46, each having a bore 48 therein, are disposed over the first contact sections 30 of first members 28 such that first ends 50 of filter members 46 lie against fixturing means 36 on first members 28, as best seen in FIG. 3. Preferably filter member 46 is of the distributed element type disclosed in U.S. Pat. No. RE 29,258, the disclosure of which is incorporated herein. Other types of filter sleeves may be used. As is known in the art, filter sleeves have inner and outer conductors which are isolated from each other. The inner conductor electrically engages the electrical terminal extending therethrough and the outer conductor provides grounding means.

Figure 5:
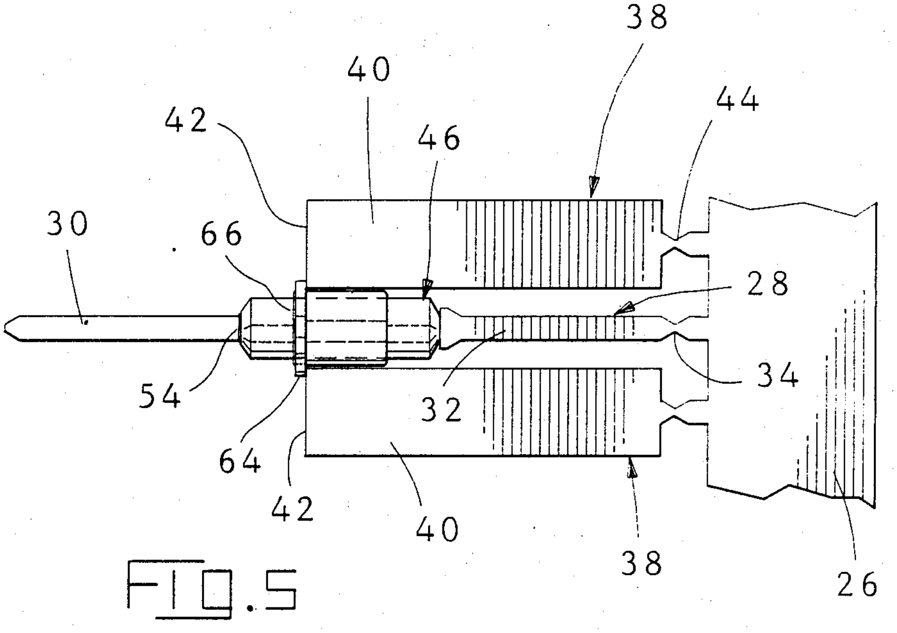
FIG. 5 is a plan view of the assemblies of FIG. 4, illustrating the means for positioning the outer members of the assemblies in accordance with the invention.
Figure 6:
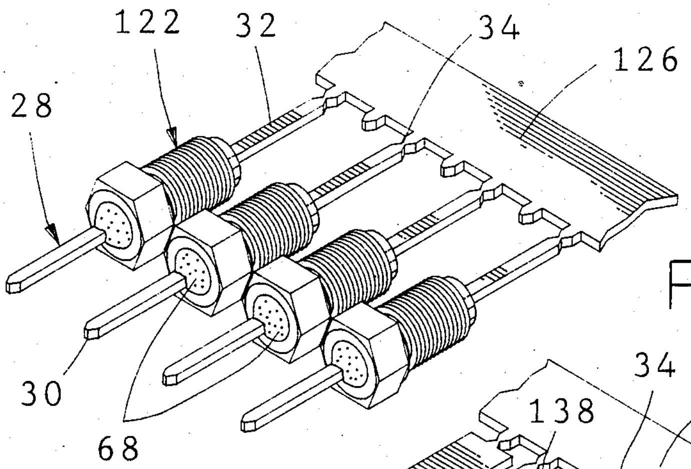
FIG. 6 is a perspective view of a continuous strip of another embodiment of electrical component assemblies made in accordance with the invention.

Solder preforms 54 are then disposed over first members 28 and positioned to lie against second ends 52 of filter members 48. Outer members 56 of eyelet assemblies 22, each having a bore 58 therein dimensioned to receive filter member 46, are then disposed over filter members 46. Outer members 56 have first and second ends 60,62 and flanges 64 extending radially outwardly from one end thereof. Outer members 56 are located in precise position by leading edges 42 of second members 38 which engage flanges 64 of outer members 56. Solder preforms 66 are disposed against the outer edge of flange 64, as best seen in FIG. 5.

Strip 20 is then exposed to sufficient heat to cause solder preforms 54,66 to soften and flow, thereby establishing electrical connection between the inner conductor of filter member 46 filter and first member 28 and between filter member 46 and outer member 56, thus securing filter member 46 to first contact section 30 of member 28 and securing the eyelet housing or outer member 56 to the outer surface or ground conductor of filter member 46. The location of the solder preforms 54,66 and the fixturing means 42 provided by the second member 38 is best seen in FIG. 5.

Figure 7:
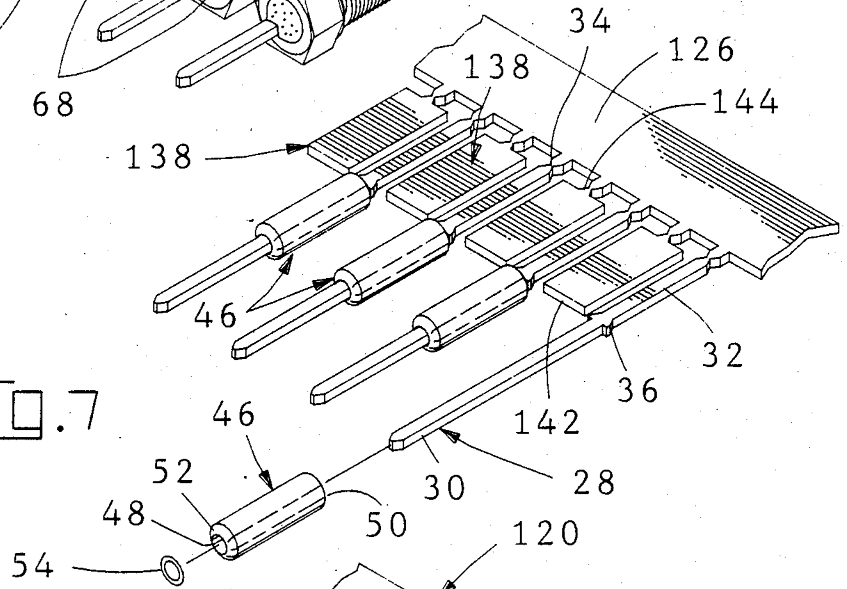
FIGS. 7 and 8 illustrate the manufacturing steps in making the assemblies of FIG. 6.
Figure 8:
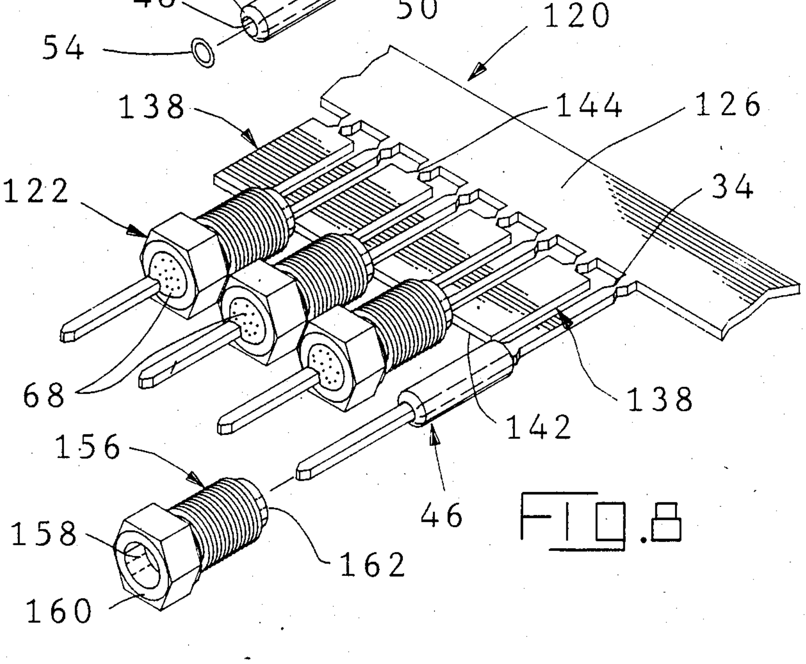
Figure 9:
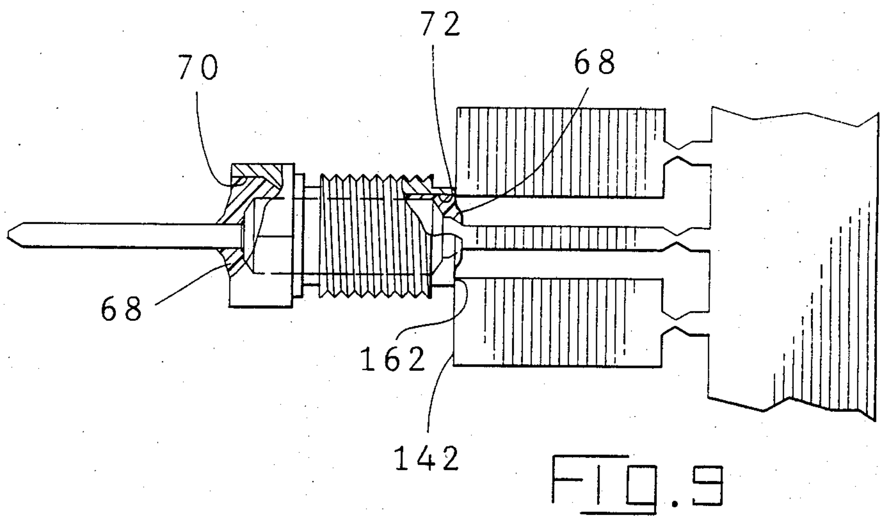
FIG. 9 is a top plan view of one of the assemblies of FIG. 6 with a portion of the outer member broken away.

FIG. 7–9 illustrate another embodiment 120 of a strip of electrical connector assemblies 122 made in accordance with the invention. Assemblies 122 are known in the industry as filtered bolt assemblies. Generally the bolts are threaded and mounted to circuit boards, back panels or the like and bolted thereto by means of a nut (not shown) or threaded hole in the panel. To make this embodiment, a strip of metal is stamped to form carrier strip 126 having a plurality of first members 28 and second members 138 extending integrally therefrom and joined thereto at spaced locations along the strip in the same manner as previously described. The same reference numerals will be used for the essentially identical parts of the various embodiments. First members 28 form the pin terminal of component assembly 122 each first member 128 including first and second contact portions 30,32. First members 28 include fixturing means 36 extending outwardly therefrom for locating filter members 46 thereon as in the embodiment shown in FIGS. 1–5. In this embodiment second members 138 which extend from carrier strip 126 are shorter than those of the previously discussed second members 38 of embodiment 22. Leading edges 142 of second members 138 provide locating means for outer members 156 so that the entire length of filter members 46 is covered by outer members 156 in the completed filtered component assemblies 122 Filter members 46 are mounted to first members 28 in the same manner as previously described. Outer members 156 are disposed over the mounted filter members 46. Outer members 156, as best seen in FIGS. 8 and 9, are located in position by leading edges 142 of second members 138 engaging bottom surfaces 162 of members 156. In the embodiment of FIG. 7–9 potting material 68 is injected into both ends 70,72 of bore 158 of outer members 156 to environmentally seal filter component assembly 122. After assemblies 122 are completed, second members 138 may be removed at 144 from carrier strip 126 to provide a continuous strip of filter assemblies 122.

Figure 10:
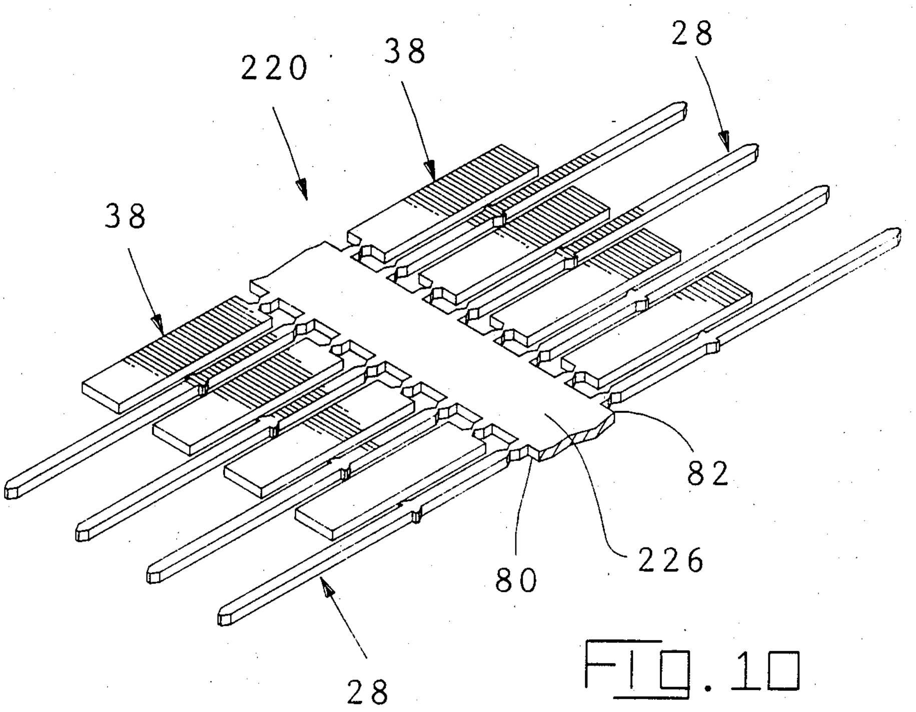
FIG. 10 is a perspective view of a further alternative embodiment of a metal strip stamped in accordance with the present invention.

FIG. 10 shows a further alternative embodiment 220 of the invention wherein the metal strip is stamped to form carrier strip 226 having first and second members extending from both sides 80,82 of carrier strip 226 thus enabling assemblies to be made along both sides of the strip.

Figure 11:
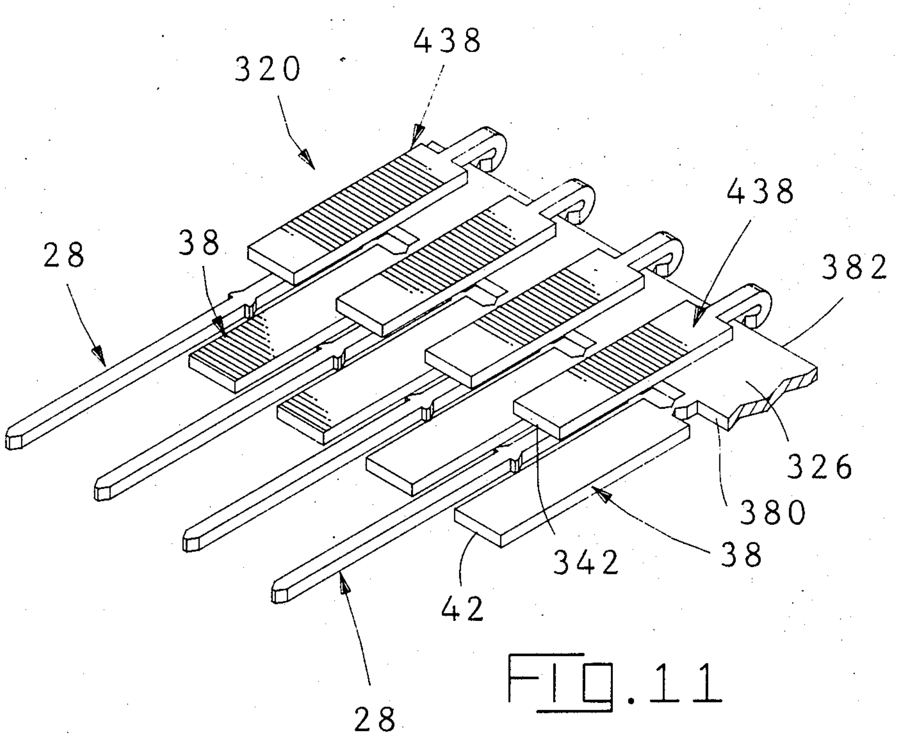
FIG. 11 is a perspective view of another alternative embodiment of a metal strip stamped in accordance with the present invention.

FIG. 11 shows another alternative embodiment 320 of the invention wherein carrier strip 326 is stamped so that members 438, formed along side 382 of strip 326 may be formed to overlie a portion of carrier strip 326 and members 38 which extend outwardly along side 380 of strip 326, thereby providing a further surface 342 for aligning components on members 28.

Figure 12:
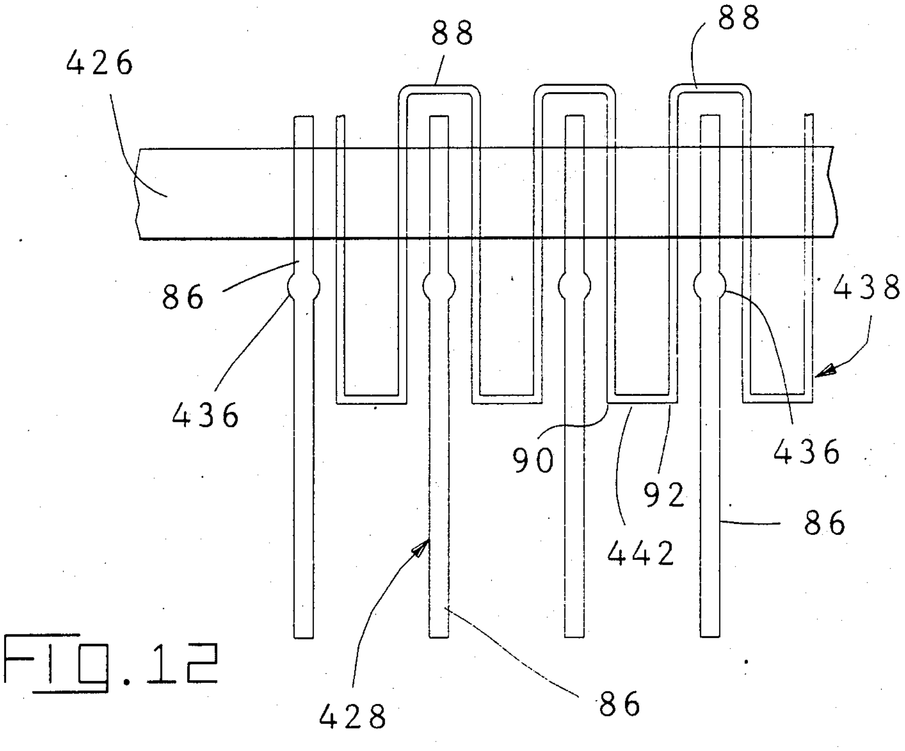
FIG. 12 is a top plan view of a still further embodiment of the invention wherein the members extending from the strip are formed of wire.

FIG. 12 shows another embodiment 420 of the invention wherein the first and second members 428,438 are formed of wire and are attached to carrier strip 426 which may comprise paper or tape. First members 428, preferably having filter locating means 436 thereon, comprise individual lengths of wire 86 spaced at selected locations along strip 426. Second members 438 are preferably formed along a continuous length 88 of wire and are interspersed between adjacent first members 428 along strip 426. The wire is formed in a die by conventional wire forming machines as known in the art. The diameter of wire 86 for first members 428, is selected to be essentially equivalent to the size of stamped members 28. Preferably, the diameter of wire 88 used for forming second members 438 is small enough to permit the wire to be bent at essentially right angles at 90,92 along leading edge 442 to permit accurate positioning of the outer members (not shown) on filtered first members as previously described.

The present invention provides a means for making electrical component assemblies in a continuous process and in a continuous strip. The strip of assemblies can be rolled onto a reel and sold either in reel form or severed from the carrier strip to provide loose piece assemblies. Generally, electrical components as shown in the preferred embodiments are used in applications where the end of a conductor is wrapped around one end of a pin terminal and soldered thereto. The other end of the pin terminal is mounted to a backpanel, a circuit board or the like. The metal shell members of the eyelet or bolt provide support for mounting as well as protecting the filter members.

The present invention permits the reel of assemblies to be shipped to a customer for later use in an end product. In addition, since the assemblies are spaced at precise locations along the carrier strip, the assemblies in strip form are suitable for use in robotic applications.

The method of assembling the component assemblies will be described with reference to FIGS. 1–5 and assembly 22 as a representative example. The preferred method of making the assemblies 22 in accordance with the invention is to pass the stamped strip 126 along a guide path in an upright position so that first members 28 extend upwardly in a vertical orientation and can be passed under a filter loading device whereby filter members 46 are dropped onto the upwardly extending first members 28 and located against the fixture means 36 on first member 28. Solder preforms 54 are dropped onto first members 28 to lie against end 52 of the filter members 46. Strip 126 is then passed under a loading device (not shown) where the outer members 56 are dropped onto extending first members 28. Second solder preform 66 are dropped over filtered first members 28 and against outer members 56. Carrier strip 126 having the parts mounted thereto is then passed under a hot air jet or other suitable means that melts the solder causing it to flow downwardly to electrically engage and mechanically secure filter member 46 to the pin terminal 28 and the outer shell member 56 to the exterior filter member 46.

The first fixturing means 36 being on first members 28 and the second fixturing means, members 30, being spaced along the same carrier strip 126 as pin terminals or first members 28 allows the entire assembly 22 to be made without using external fixturing devices for properly locating the various components of the assemblies. By positioning carrier strip 126 in such a manner that the first and second members 28,38 extend upwardly, the force of gravity will cause filter members 46 and outer members 56 to drop onto the pin terminal and be located by their respective fixturing means. It is to be understood that gravity can also be used in the assembly of devices on a strip such as that shown in FIG. 10 in that one-half of the members can be assembled and soldered and the the strip turned 180 degrees and the second half of the members loaded.

In the embodiment of FIG. 11 the folded over portion from the opposite side of the carrier strip provides a further means for locating the outer member in the proper position on the terminal.

The wire strip of FIG. 12 can be loaded in a similar manner.

It is to be understood that the electrical component assemblies shown in the preferred embodiments are merely representative of the various assemblies that can be made in accordance with the present invention. It is to be further understood that the assemblies need not be complete electrical assemblies but can be assemblies which require additional members to be mounted in precise location on a separate member. It is thought that the method of manufacturing components on a continuous strip of the present invention and many of its attendant advantages will be understood from the forgoing description. It will also be apparent that various changes may be made in the form, construction and arrangement of the part thereof without departing from the spirit or scope of the invention or sacrificing any of its material advantages. The form herein described is merely a preferred or exemplary embodiment of the invention.

We claim:

1. An intermediate article for use with a plurality of components in making a continuous strip of assemblies including said components, comprising:

a carrier strip having a plurality of first and second members integrally extending therefrom and joined thereto at spaced locations along one longitudinal side thereof, each of said first members having at least one second member associated therewith and therebeside;

said carrier strip further having a plurality of second members extending outwardly along a second longitudinal side thereof;

said second members being formed members having at least one surface lying outside the plane of said carrier strip; and locating means provided by each of said second members for enabling at least said components to be assembled to said first members n a precisely located relationship, said locating means being adapted to be engaged by a specific portion of said components, whereby after said components are secured to said first members a plurality of assemblies is defined on said carrier strip, with said components and said first members located precisely with respect to each other by said second members during securing thereof without requiring separate fixturing devices.

2. An intermediate article for use with a plurality of components, in making a continuous strip of assemblies including said components, comprising:

a carrier strip having a plurality of first and second members integrally extending therefrom and joined thereto at spaced locations along at least one side thereof, each of said first members having at least one second member associated therewith and therebeside;

said carrier strip further having a plurality of second members extending outwardly along a second side thereof wherein at least some of said second members on said second side are bent so that they overlie said first and second members on said other side; and locating means provided by each of said second members for enabling at least said components to be assembled to said locating means providing at least three points of location adapted to be engaged by a specific portion of components, whereby after said components are secured to said first members a plurality of assemblies is defined on said carrier strip, with said components and said first members located precisely with respect to each other by said second members during securing thereof without requiring separate fixturing devices.

3. A method for making an intermediate article for use in making a continuous strip of assemblies having a plurality of at least first components secured thereto, comprising the steps of:

identifying a plurality of at least first components to comprise portions of a continuous strip of assemblies;

forming a carrier strip having a plurality of first and second members integrally joined to and extending outwardly therefrom at selected locations along at least one edge thereof with at least one second member associated with each said first member, said forming step being adapted to define locating means on said second members to correspond to and cooperate with portions of said first components to locate said first components with respect to associated said first members, said forming step further including forming a plurality of said second members along a second edge of said carrier strip and bending at least some of said second members along said second edge so that they overlay said first and second members along said one edge of said carrier strip, whereby said second members along said one edge and said bent second members define at least three points for precisely positioning a said respective component in an exact location on said first member during assembly thereof without requiring separate fixturing devices.

4. A combination including a plurality of discrete components and a carrier strip to which said components are to be affixed to form a continuous strip of assemblies;

said carrier strip having a plurality of first and second members integrally extending therefrom and joined thereto at spaced locations therealong, each of said first members having at lest one second member associated therewith and therebeside; and locating means provided by each of said second members for enabling at least said components to be assembled to said first members in a precisely located relationship, said locating means being adapted to be engaged by a specific portion of said components; whereby after said components are secured to said first members a plurality of assemblies is defined on said carrier strip, with said components and said first members located precisely with respect to each other by said second members during securing thereof without requiring separate fixturing devices.

5. The combination of claim 4, further including means on said first members for enabling at least further components to be assembled on said first members, said first members being adapted to be received in respective ones of said further components and secured thereto.

6. The combination of claim 4 wherein said first member is a stamped pin terminal member.

7. The combination of claim 4 wherein said first members are joined to said carrier strip at severable locations enabling said assemblies to be severed from said strip.

8. The combination of claim 4 wherein said second members are joined to said carrier strip at severable locations enabling said second members to be severed from said strip of assemblies.

9. The combination of claim 4 wherein said carrier strip and said first and second members lie in the same plane.

10. The combination of claim 4 wherein said first and second members extend outwardly from both sides of said carrier strip.

11. The combination of claim 4 wherein said second members extend outwardly from both sides of said carrier strip.

12. The combination of claim 11 wherein said second members are formed members having at least one surface lying outside the plane of the carrier strip.

13. The combination of claim 11 wherein at least some of said second members on one side are bent so that they overlie said first and second members on said other side thus providing at least three points of location for said components.

14. A continuous strip of assemblies comprising:

an article including a carrier strip having a plurality of first and second members integrally extending therefrom and joined thereto at spaced locations therealong, each of said first members having at least one second member associated therewith and therebeside; and locating means provided by each of said second members for enabling at least third members to be assembled to said first members in a precisely located relationship, said locating means being adapted to be engaged by cooperating locating means on said third members; and a plurality of third members, each third member being assembled to respective ones of said first members, said third members including locating means that cooperate with said locating means of said second members to precisely locate said third members with respect to said first members to form said assemblies.

15. The continuous strip of assemblies as defined in claim 14 further including means on said first members for enabling at least fourth members to be assembled on said first members, said first members being adapted to be received in respective ones of said fourth members and secure thereto.

16. The continuous strip of assemblies as defined in claim 15 further including fourth members, respective ones of said fourth members being secured to and in electrical engagement with corresponding first members, said fourth members being received by respective ones of said third members and secured thereto.

17. The continuous strip of assemblies as defined in claim 16 wherein said fourth members are filter sleeve members secured to and in electrical engagement with said first members.

18. A method for making a continuous trip of assemblies comprising the steps of:

forming an article including a carrier strip having a plurality of first and second members integrally joined to and extending outwardly therefrom at selected locations therealong, said first and second members being positioned along said carrier strip such that said at least one second member lies alongside one of each said first members, said second member being provided with means for precisely locating a third member in an exact location on said first member, said means for locating being adapted to be engaged by cooperating locating means on said third member;

assembling third members to respect ones of said first members, said third members including cooperating locating means that cooperate with said locating means of said second members to precisely locate said third members with respect to said first members to form said assemblies.

19. The method for making a continuous strip of assemblies as defined in claim 18, further comprising the steps of:

providing means on said first members for enabling at least fourth members to be assembled on said first members, said first members being adapted to be received in respective ones of said fourth members and secured thereto;

disposing fourth members on respective first members in electrical engagement therewith and secured thereto, said fourth members being received in respective ones of said third members and secured thereto.

20. The method for making a continuous strip of assemblies as defined in claim 18 wherein said fourth members are filter sleeve members.

21. The method for making a continuous strip of assemblies as defined in claim 18 wherein said locating means are surface portions facing outwardly from said carrier strip; said cooperating locating means are surface portions of said third members facing said carrier strip and said locating comprises stopping movement of said third members toward said carrier strip upon engagement of said locating means and said cooperating means.

* * * * *

UNITED STATES PATENT OFFICE
CERTIFICATE OF CORRECTION

Patent No. 4,904,539 Dated February 27, 1990

Inventor(s) John P. Kling and Richard F. Stone Jr.

It is certified that error appears in the above-identified patent and that said Letters Patent is hereby corrected as shown below:

In the Claims:

Column 7, claim 4, Line 65 - the word "lest" should be --least--.

Column 9, claim 18, Line 25 - the word "respect" should be --respective--.

Signed and Sealed this

Twenty-sixth Day of March, 1991

*Attest:*

HARRY F. MANBECK, JR.

*Attesting Officer*

*Commissioner of Patents and Trademarks*